US011567124B2

United States Patent
Wu et al.

(10) Patent No.: US 11,567,124 B2
(45) Date of Patent: Jan. 31, 2023

(54) WAFTER, WAFER TESTING SYSTEM, AND METHOD THEREOF

(71) Applicant: PLAYNITRIDE DISPLAY CO., LTD., Miaoli County (TW)

(72) Inventors: Jyun-De Wu, Miaoli County (TW); Yen-Lin Lai, Miaoli County (TW); Chi-Heng Chen, Miaoli County (TW)

(73) Assignee: PLAYNITRIDE DISPLAY CO., LTD., Miaoli County (TW)

( * ) Notice: Subject to any disclaimer, the term of this patent is extended or adjusted under 35 U.S.C. 154(b) by 337 days.

(21) Appl. No.: 16/896,280

(22) Filed: Jun. 9, 2020

(65) Prior Publication Data

US 2021/0148972 A1  May 20, 2021

(51) Int. Cl.
*G01R 31/302* (2006.01)
*H01L 33/00* (2010.01)

(52) U.S. Cl.
CPC .......... *G01R 31/302* (2013.01); *H01L 33/005* (2013.01)

(58) Field of Classification Search
CPC ........ G01R 1/04; G01R 1/07; G01R 31/2648; G01R 31/2808; G01R 31/302; G01R 31/303; G01R 31/307; G01R 31/312
See application file for complete search history.

(56) References Cited

U.S. PATENT DOCUMENTS

| 5,808,744 A * | 9/1998 | Moriya | H04N 7/188 |
| | | | 250/559.4 |
| 7,026,832 B2 * | 4/2006 | Chaya | G01R 31/2891 |
| | | | 324/754.1 |
| 2004/0207836 A1 * | 10/2004 | Chhibber | G01N 21/8806 |
| | | | 356/237.4 |

FOREIGN PATENT DOCUMENTS

TW     201329435 A1    7/2013

* cited by examiner

*Primary Examiner* — Tung X Nguyen
(74) *Attorney, Agent, or Firm* — WPAT, PC

(57) ABSTRACT

Herein disclosed are a wafer, a wafer testing system, and a method thereof. Said wafer testing method comprises the following steps. First, an incident light is provided toward a wafer. And, a wafer surface image corresponded to the wafer is generated. Then, determining whether the wafer surface image has a plurality of first strips and a plurality of second strips, and the plurality of first strips and the plurality of second strips are symmetrical. When the wafer surface image has the plurality of first strips and the plurality of second strips, and the plurality of first strips and the plurality of second strips are symmetrical, a qualified signal corresponded to the wafer is provided.

17 Claims, 5 Drawing Sheets

WAFTER, WAFER TESTING SYSTEM, AND METHOD THEREOF

CROSS REFERENCE TO RELATED APPLICATION

The present application claims priority to Taiwan patent application Serial No. 108141700 filed on Nov. 18, 2019, the entire content of which is incorporated by reference to this application.

BACKGROUND OF THE INVENTION

1. Field of the Invention

The present invention pertains to a semiconductor structure, a testing method and a testing system, in particular to a wafer, a non-contact wafer testing method and a wafer testing system

2. Description of the Prior Art

In general, in the manufacturing process of micro LEDs (µLEDs), various tests and inspections are required to determine the quality of the micro LED. For example, the testing procedure after an epitaxy process may include using a probe to contact electrodes of the micro LED, and then providing current through the probe to test whether the micro LED can emit light normally. However, due to the amount of micro LED in the wafer is huge, either to test the micro LEDs in the wafer one by one, or to sample a part of the micro LEDs in the wafer, it will take considerable time. Besides, because the size of the micro LED is in the micron level, when the electrode of the micro LED is touched by the probe, the micro LED can also be damaged accidentally.

Therefore, there is a need in industry for a new testing method and system that can quickly determine the quality of the entire wafer in the epitaxial process before the wafer is fabricated into the micro LEDs, so as to adjust recipes or variables in the rest processes, and improve the testing efficiency.

SUMMARY OF THE INVENTION

The present invention provides a wafer testing method, which can quickly determine the quality of a wafer in the epitaxial process by a surface image of the wafer, thereby speeding up the testing of the wafer and preventing micro LEDs on the wafer from being damaged in the rest processes.

The present invention discloses a wafer testing method. The wafer testing method comprises the following steps. First, an incident light is provided toward a wafer. And, a wafer surface image corresponded to the wafer is generated. Then, determining whether the wafer surface image has a plurality of first strips and a plurality of second strips, and the plurality of first strips and the plurality of second strips are symmetrical. When the wafer surface image has the plurality of first strips and the plurality of second strips, and the plurality of first strips and the plurality of second strips are symmetrical, a qualified signal corresponded to the wafer is provided.

In some embodiments, the plurality of first strips and the plurality of second strips are symmetrical which indicates that the plurality of first strips and the plurality of second strips are symmetrical to a center of the wafer surface image. A first distance from the center of the wafer surface image can define a first circumference, the plurality of first strips and the plurality of second strips are symmetrical which can indicate that and the plurality of first strips and the plurality of second strips are regularly arranged on the first circumference. In addition, the plurality of first stripes can extend from the center of the wafer surface image to the first circumference. Besides, the plurality of first strips and the plurality of second strips are symmetrical which can indicate that the plurality of first strips and the plurality of second strips are symmetrical to a line passing through the center of the wafer surface image. Moreover, the plurality of first strips in the wafer surface image can indicate that a first light received from a corresponding position of the wafer corresponds to a first measurement range, and the plurality of second stripes in the wafer surface image can indicate that a second light received from the corresponding position of the wafer corresponds to a second measurement range, the first measurement range and the second measurement range do not overlap. For example, the first measurement range and the second measurement range can be ranges of full width at half maximum (FWHM), the first measurement range can be smaller than the second measurement range, and the ratio of the first measurement range to the second measurement range can be less than 1 and is greater than or equal to 0.5.

The present invention provides a wafer testing system, which can receive light from the wafer and quickly determine the quality of a wafer in the epitaxial process by a surface image of the wafer, thereby adjusting recipes or variables in the rest processes, and speeding up the testing of the wafer.

The present invention discloses a wafer testing system which comprises a light emitting module, a light receiving module, and a processing module. The light emitting module provides an incident light toward a wafer. The light receiving module receives light from the wafer, and generates a wafer surface image corresponded to the wafer. The processing module, coupled with the light receiving module, determines whether the wafer surface image is symmetrical or not, and generating a qualified signal accordingly. When the wafer surface image has a plurality of first strips and a plurality of second strips, and the plurality of first strips and the plurality of second strips are symmetrical, the processing module generates the qualified signal.

In some embodiments, the plurality of first strips and the plurality of second strips can be symmetrical to a center of the wafer surface image, and the plurality of first strips and the plurality of second strips can extend radially outward from the center of the wafer surface image, respectively. Besides, the plurality of first strips and the plurality of second strips are symmetrical which can indicate that the plurality of first strips and the plurality of second strips are symmetrical to a line passing through the center of the wafer surface image. Moreover, the plurality of first strips in the wafer surface image can indicate that a first light received from a corresponding position of the wafer corresponds to a first measurement range, and the plurality of second stripes in the wafer surface image can indicate that a second light received from the corresponding position of the wafer corresponds to a second measurement range. For example, the first measurement range and the second measurement range can be ranges of full width at half maximum (FWHM), the first measurement range can be smaller than the second measurement range, and the ratio of the first measurement range to the second measurement range can be less than 1 and is greater than or equal to 0.5.

The present invention provides a wafer, which can be tested by the wafer testing method of the present invention. The wafer testing method can quickly determine the quality of a wafer in the epitaxial process by a surface image of the wafer, thereby adjusting recipes or variables in the rest processes, and speeding up the testing of the wafer.

The present invention discloses a wafer, which can be tested by the wafer testing method of the present invention. The wafer comprises a patterned substrate and an epitaxial structure. The epitaxial structure is disposed on the patterned substrate. The wafer surface image corresponded to the epitaxial structure is generated by the wafer testing method of the present invention, the wafer surface image has the plurality of first strips and the plurality of second strips, and the plurality of first strips and the plurality of second strips are symmetrical.

In some embodiments, the plurality of first strips and the plurality of second strips can be symmetrical to a center of the wafer surface image. The plurality of first strips and the plurality of second strips can extend radially outward from the center of the wafer surface image, respectively. And, the wafer surface image can be corresponded to a photoluminescence spectrum.

To summarize, the wafer, the wafer testing system, and method thereof can receive light from the wafer after being excited by light without contacting the wafer. Furthermore, the present invention can determine the quality of the wafer in the epitaxial process by examining whether the wafer surface image has a symmetrical pattern, thereby adjusting recipes or variables in the rest processes, and speeding up the testing of the wafer.

BRIEF DESCRIPTION OF THE APPENDED DRAWINGS

DETAILED DESCRIPTION OF THE INVENTION

The features, objectives, and functions of the present invention are further disclosed below. However, it is only a few of the possible embodiments of the present invention, and the scope of the present invention is not limited thereto; that is, the equivalent changes and modifications done in accordance with the claims of the present invention will remain the subject of the present invention. Without departing from the spirit and scope of the invention, it should be considered as further enablement of the invention.

Figure 1A:
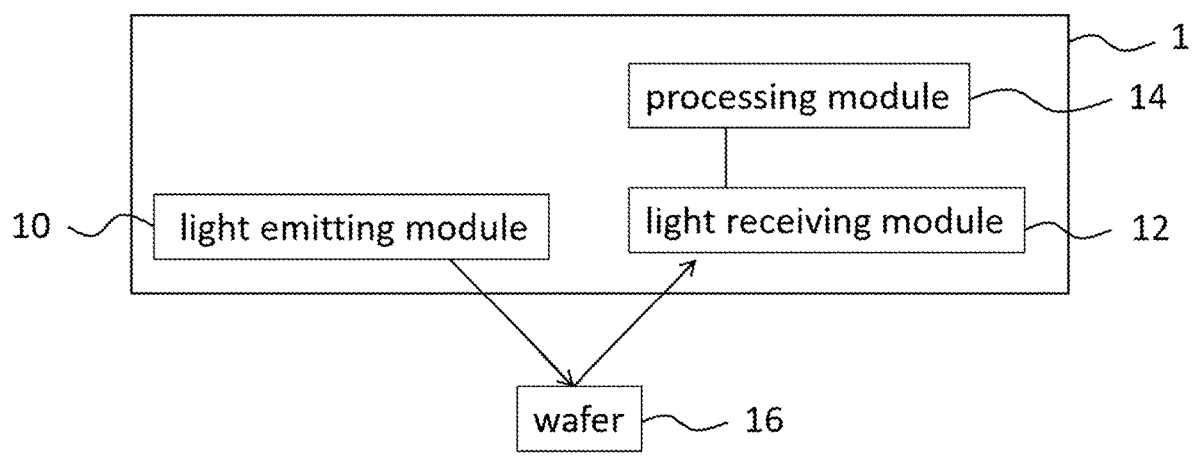
FIG. 1A is a block diagram of a wafer testing system in accordance with an embodiment of the present invention.
Figure 1B:
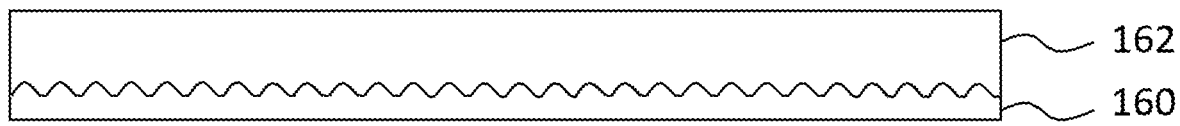
FIG. 1B is a schematic diagram of a wafer in accordance with an embodiment of the present invention.

Please refer to FIG. 1A and Fig together. 1B, FIG. 1A is a block diagram of a wafer testing system in accordance with an embodiment of the present invention, and FIG. 1B is a schematic diagram of a wafer in accordance with an embodiment of the present invention. As shown in the figures, the wafer testing system 1 disclosed in this embodiment can be used to test the quality of the wafer 16. The wafer testing system 1 can comprises a light emitting module 10, a light receiving module 12, and a processing module 14. In practice, the wafer 16 may comprises a patterned substrate 160 and an epitaxial structure 162 disposed on the patterned substrate 160. The wafer 16 may be separated into a plurality of micro LEDs in an isolation process. Besides, the patterned substrate 160 may have pattern in nanometer level, for example, within 2000 nanometers. This embodiment does not limit whether the wafer 16 has completed all the epitaxial processes of fabricating a micro LED. For example, the wafer 16 may be a finished/semi-finished product in the epitaxial process of fabricating the micro LED. As long as the epitaxial structure 162 exists on the patterned substrate 160, it should belong to the scope of the wafer 16 in this invention. In addition, the light receiving module 12 may be coupled with the processing module 14, and the light-emitting module 10 and the light-receiving module 12 may be on the same side of the wafer 16, e.g. the side facing the epitaxial structure 162. The following describes the components of the wafer testing system 1.

The light emitting module 10 may project an incident light toward the wafer 16, and the light receiving module 12 may be used to receive light from the wafer 16. The light emitting module 10 can be used to emit a parallel and uniform incident light directed toward the wafer 16. Said incident light can be used to excite the epitaxial structure 162 of the wafer 16 so that the electrons in the epitaxial structure 162 are excited to a higher excited state. After a period of time, the excited electrons will decay to lower excited states or return to the ground state, and the decayed electrons will release excess energy in the form of light, e.g. photoluminescence (PL). In practice, the center wavelength of the incident light provided by the light emitting module 10 may be corresponded to the wafer to be tested, especially the epitaxial material of the micro LED. For example, to excite epitaxial materials with different lattice constants and energy level widths, may need different incident lights with different center wavelengths. In an example, the center wavelength of the incident light can, but not limited to, be selected from 325 nm, 375 nm, 405 nm, or other wavelengths suitable for exciting the epitaxial structure 162, and the center wavelength of the incident light could be smaller than the center wavelength of the photoluminescence emitted from the epitaxial structure 162. Those with ordinary skill in the art can also adjust the aforementioned central wavelength of incident light slightly, as long as the epitaxial structure 162 can be excited and emit photoluminescence.

In a practical example, the light emitting module 10 can be used as a laser light source, and the light receiving module 12 can be a spectrometer. After the epitaxial structure 162 of the wafer 16 is excited by the incident light to emit light (e.g. photoluminescence), the light receiving module 12 can receive and measure the light from the wafer 16, and generate a wafer surface image corresponded to the wafer 16. Here, the wafer surface image and the wafer 16 should have a positional relationship, and patterns shown in the wafer surface image represents that the light receiving module 12 can receive the light with different characteristics from the corresponding position of the wafer 16. In addition, in order to analyze the wafer surface image, the light receiving module 12 can also be coupled with the processing module 14. The processing module 14 can be used to determine whether the wafer surface image is symmetrical, thereby determining whether the quality of the wafer 16 is acceptable.

Figure 2:
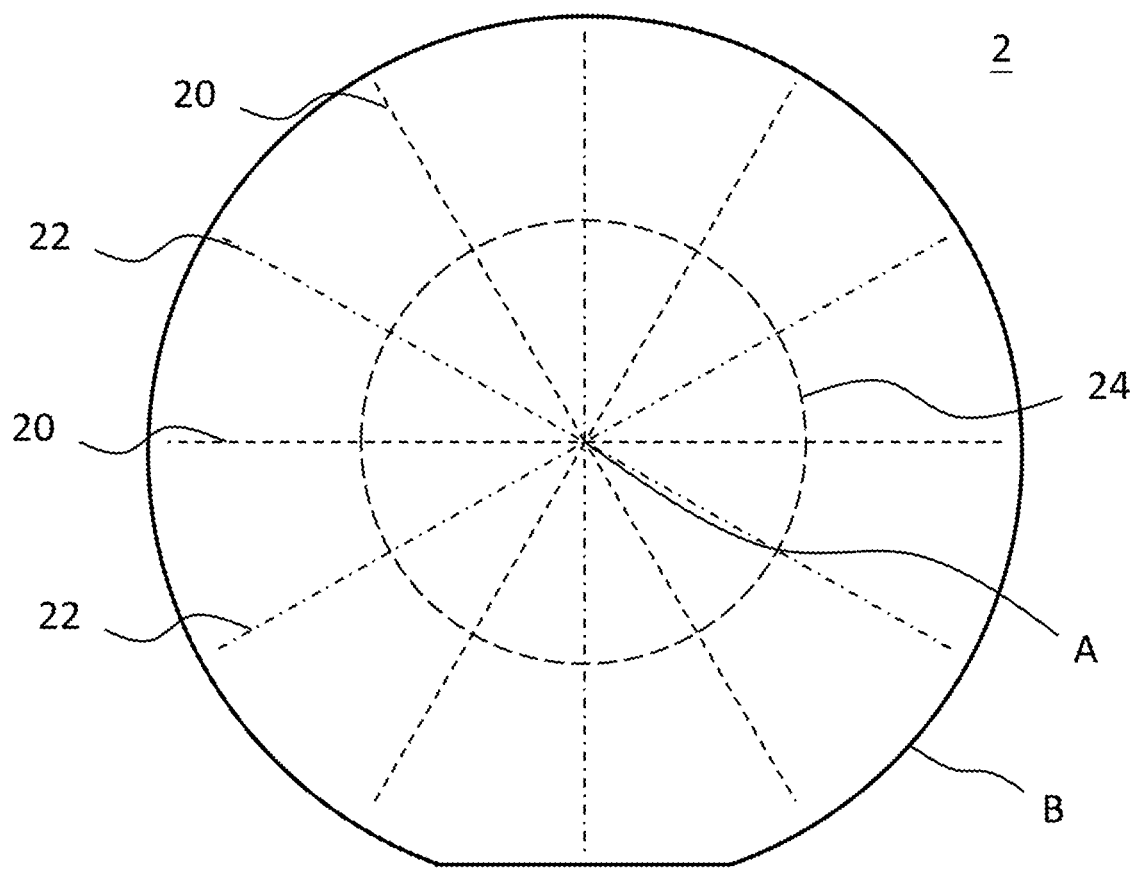
FIG. 2 is a schematic diagram of a wafer surface image in accordance with an embodiment of the present invention.

In order to explain the content of the wafer surface image, please refer to FIGS. 1A and 2 together. FIG. 2 is a schematic diagram of a wafer surface image in accordance with an embodiment of the present invention. As shown in the figures, the wafer surface image 2, generated by the light receiving module 12, may include a plurality of first stripes 20 (short dashed lines) and a plurality of second stripes 22 (dot chain lines). As described above, the wafer surface image 2 and the wafer 16 may have a positional relationship. For example, the center A of the wafer surface image 2 may be substantially the center of the wafer 16. Besides, each first stripe 20 in the wafer surface image 2 corresponds to the wafer 16 can be regarded as a first region in the wafer 16 in this embodiment. And, each second stripe 22 in the wafer surface image 2 corresponds to the wafer 16 can be regarded as a second region in the wafer 16 in this embodiment.

In the example of FIG. 2, the wafer surface image 2 may have several first stripes 20 extending between the center A and the edge B, and may also have several second stripes 22 extending between the center A and the edge B. This embodiment does not limit ends of each first stripe 20 and the second stripe 22 to be at the center A, for example, the center A may also be on the extension of the first stripe 20 and the second stripe 22. Similarly, this embodiment does not limit ends of the first stripe 20 and the second stripe 22 to be at the edge B, for example, the first stripe 20 and the second stripe 22 may only extend toward the edge B without contacting the edge B. In practice, the first stripe 20 and the second stripe 22 may have different stripe widths, for example, each of the first stripe 20 and the second stripe 22 is more likely to occupy a certain area or cover a certain area. In other words, the short dashed line marked on the wafer surface image 2 can be regarded as the center line of the first stripe 20, and within a certain distance on both sides of the short dashed line, it can be regarded as the first stripe 20. Similarly, the dot chain line marked on the wafer surface image 2 can be regarded as the center line of the second stripe 22, and within a certain distance on both sides of the dot chain line, it can be regarded as the second stripe 22. Although FIG. 2 illustrates six first stripes 20 and six second stripes 22, and a central angle between the adjacent first stripes 20 and second stripes 22 could be 60 degrees as an example. However, this embodiment does not limit the number of the first stripes 20 and the second stripes 22, and also does not limit the central angle between the adjacent first stripes 20 and the second stripes 22.

In one example, the first stripe 20 and the second stripe 22 near the center A may have a narrower stripe width, and the first stripe 20 and the second stripe 22 near the edge B may have a wider stripe width. In other words, the first stripes 20 and the second stripes 22 in the wafer surface image 2 may be close to a fan shape. In addition, those with ordinary skill in the art should also understand that since the wafer surface image 2 is a measurement result of the light receiving module 12, it cannot be ruled out that errors caused by various measurement conditions, and it might make the wafer surface image 2 not clear enough. Taking the first stripes 20 as an example, a plurality of first stripes 20 may have different resolutions in the wafer surface image 2. For example, it is possible that one of the first stripes 20 is very clear and the boundary is very obvious, while the relative position of the other one of the first stripes 20 has a blurry or even partly discontinuous pattern. As long as it can be seen that the blurred or discontinuous pattern in the wafer surface image 2 has a center line, it should be regarded as the first stripe 20 of this embodiment. Similarly, at the relative position of the second stripes 22, there are more blurred or even some discontinuous patterns, as long as the blurred or discontinuous pattern in the wafer surface image 2 has a center line, it should be regarded as the second stripe 22 of this embodiment.

In one example, the plurality of first stripes 20 in the wafer surface image 2 can be used to indicate that light received, by the light receiving module 12, from the first area of the wafer corresponds to a first measurement range. And, the plurality of second stripes 22 in the wafer surface image 2 can be used to indicate that light received, by the light receiving module 12, from the second area of the wafer corresponds to a second measurement range. In practice, since the light receiving module 12 is used to receive photoluminescence from various positions in the wafer 16, the wafer surface image 2, shown the plurality of first stripes 20 and the plurality of second stripes 22, indicates the light (e.g. photoluminescence) respectively emitted from in the first area and the second area of the wafer 16 should have some differences in optical characteristic measurements, such as luminous intensity, wavelength distribution, or full width at half maximum (FWHM) of wavelength.

For example, during the epitaxial process of the wafer 16, the photoluminescence emitted from different areas of the epitaxial structure 162 theoretically should have the same center wavelength when the materials and structures are the same. However, in the actual situation, since the wafer 16 is formed by the nano-level patterned substrate 160 and the epitaxial structure 162 disposed thereon, the nano-level patterned substrate 160 may be uneven that make the epitaxial structure 162 has differences in different areas. In addition, warping of the patterned substrate 160 may occur during the epitaxial process, which may cause the difference in the epitaxial uniformity during the epitaxial process. Besides, the incident light may have interference in the pattern of the patterned substrate 160 while testing the wafer 16. Therefore, after the wafer 16 has been tested by the wafer testing method of the present invention, the FWHM of photoluminescence may be different in the first area and the second area of the wafer 16. When the measurement ranges are used to indicate the FWHM, the first measurement range is smaller than the second measurement range, and the ratio of the first measurement range to the second measurement range is less than 1 and is greater than or equal to 0.5. For the wafer 16 has different measurement ranges but has symmetrical areas, we can expect that the micro LEDs manufactured from the wafer 16 will have acceptable quality without serious problems in uniformity. Assuming that the center wavelength of the photoluminescence is 420 nm, the first stripe 20 in the wafer surface image 2 can represent that the FWHM of the photoluminescence is 17 nm to 18 nm (first measurement range) in the first area of the wafer 16. And, the second stripe 22 in the wafer surface image 2 can represent that the FWHM of the photoluminescence is 19 nm to 20 nm (second measurement range) in the second area of the wafer 16. Therefore, the first stripes 20 and the second stripes 22 in this embodiment can represent the first measurement range and the second measurement range corresponded to different areas (first areas and second areas) of the wafer 16. In addition, the first measurement range and the second measurement range should be different, and the first measurement range and the second measurement range do not overlap each other.

Besides, those of ordinary skill in the art should understand the definition of FWHM, for example, when the center wavelength of the photoluminescence is 420 nm and the FWHM is 18 nm, it means that the intensity of the photoluminescence with a wavelength outside 402 nm and 438 nm should have the intensity less than half of the photoluminescence with a wavelength of 420 nm. In another example, in addition to the FWHM, the first measurement range and the second measurement range may also indicate that the different center wavelengths of the photoluminescence or different intensity distributions of the photoluminescence, that is, the wafer 16 may emit photoluminescence with different measurement ranges in the first area and the second area.

Please continue to refer to FIG. 1A and FIG. 2, after the processing module 14 receives the wafer surface image 2, it needs to determine whether the wafer surface image 2 is symmetrical. In one example, if the plurality of first stripes 20 and the plurality of second stripes 22 in the wafer surface image 2 are symmetrical to the center A, the processing module 14 can determine that the wafer surface image 2 is symmetrical. Here, the plurality of first stripes 20 and the plurality of second stripes 22 can be regarded as a kind of point-symmetrical pattern. For example, if each first stripe 20 extends from the center A, the angle between the center lines of two adjacent first strips 20 is fixed, and the widths of the plurality of first strips 20 are substantially equal. It can be said that the plurality of first stripes 20 are symmetrical. The criteria can also be applied to the plurality of second stripes 22, which will not be repeated in this embodiment. After the processing module 14 determines that the plurality of first stripes 20 and the plurality of second stripes 22 are symmetrical, it can generally determine that the wafer surface image 2 is symmetrical.

In practice, when determining whether the wafer surface image 2 is symmetrical, the processing module 14 can also draw a virtual circumference 24 (first circumference) at a predetermined radius (first distance) from the center A of the wafer surface image 2 (long dashed line). Assuming that the plurality of first stripes 20 and the plurality of second stripes 22 are regularly arranged on the circumference 24, then the processing module 14 can determine the wafer surface image 2 symmetry. For example, assuming that a second stripe 22 is sandwiched between two adjacent first stripes 20 on the circumference 24, and the plurality of first stripes 20 and the plurality of second stripes 22 are arranged at intervals, the processing module 14 can determine that the wafer surface image 2 is symmetrical. Or, assuming that not only the plurality of first stripes 20 and the plurality of second stripes 22 are arranged at intervals on the circumference 24, but also that the second stripes 22 are equally spaced from the adjacent first stripes 20, the processing module 14 can determine the wafer surface image 2 is symmetrical. Moreover, assuming that each first stripe 20 on the circumference 24 occupies a similar arc length on the circumference 24, and the plurality of first stripes 20 and the plurality of second stripes 22 are arranged at intervals, the processing module 14 can determine the wafer surface image 2 is symmetrical. Furthermore, within the circumference 24, not only the plurality of first stripes 20 and the plurality of second stripes 22 are arranged at intervals, and each first stripe 20 extends from the center A, then the processing module 14 can determine the wafer surface image 2 is symmetrical. In an example, the first distance can be half of the distance from the center A to the edge of the wafer surface image 2 (e.g. half radius of the wafer), and the first distance can be regarded as a radius of the circumference 24. As long as the first stripes 20 and the second stripes 22 can be found at the circumference 24, and the first stripes 20 and the second stripes 22 are symmetrical, respectively, the processing module 14 can determine the wafer surface image 2 is qualified.

In another example, the plurality of first stripes 20 and the plurality of second stripes 22 may be a line-symmetrical pattern in addition to a point-symmetrical pattern. Taking the example shown in FIG. 2, assuming that one of the straight lines passing through the center A is the axis, if the plurality of first stripes 20 and the plurality of second stripes 22 are symmetric with respect to the axis, the processing module 14 can determine the wafer surface image 2 is symmetrical. Those of ordinary skill in the art should understand that there are many ways for the processing module 14 to determine whether the wafer surface image 2 is symmetrical, as long as the wafer surface image 2 has the first stripes 20 and the second stripes 22, and is at least partially repetitive and periodic, which should be able to indicate the wafer surface image 2 is symmetrical. In practice, when the processing module 14 determines that the wafer surface image 2 is symmetrical, the processing module 14 can generate a qualified signal corresponded to the wafer 16 so that the wafer inspection system 1 can quickly mark the wafer 16 as qualified. Conversely, when the processing module 14 determines that the wafer surface image 2 is asymmetric, the processing module 14 will not generate the qualified. signal corresponded to the wafer 16. Therefore, the wafer testing system 1 can directly mark the wafer 16 as unqualified, or the wafer testing system 1 may not need to directly give a conclusion about whether the wafer 16 is qualified or not. In one example, when the processing module 14 determines that the wafer surface image 2 is asymmetric, the processing module 14 may mark the wafer 16 as to be re-test, and then use other testing methods to determine the quality of the wafer 16.

Figure 3:
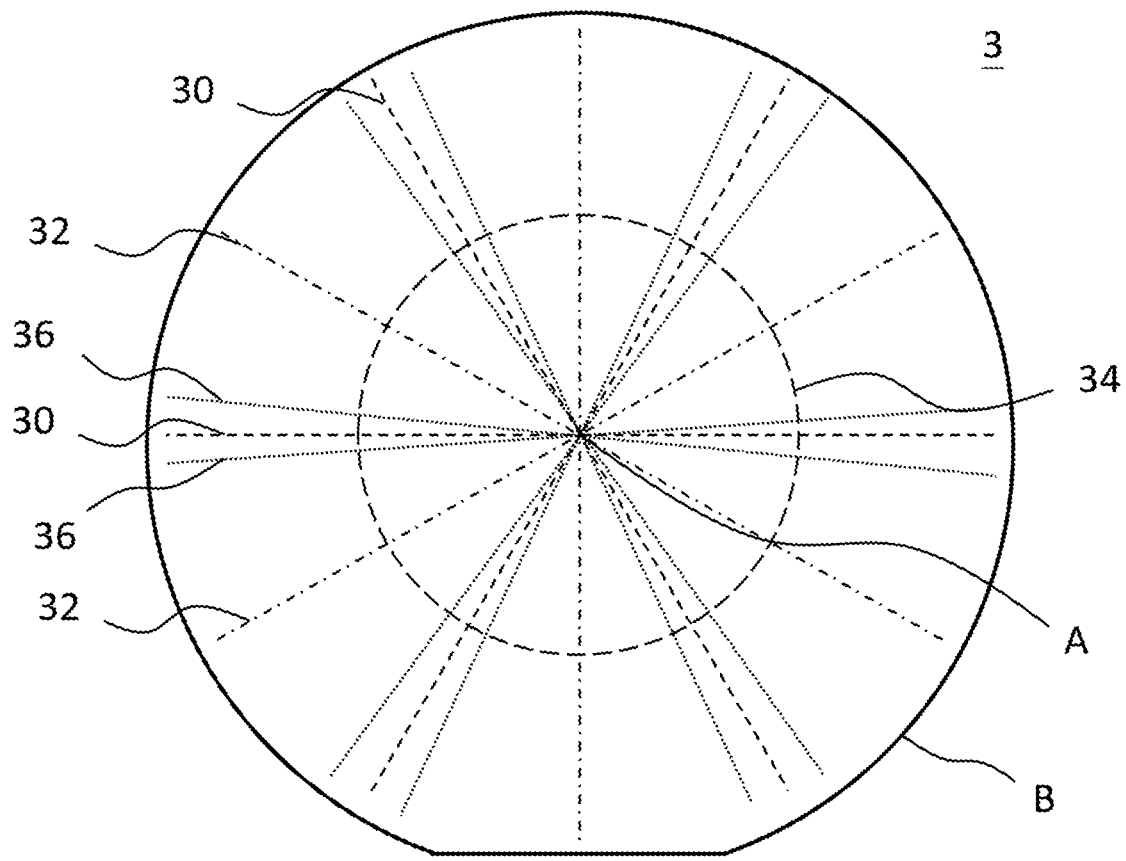
FIG. 3 is a schematic diagram of a wafer surface image in accordance with another embodiment of the present invention.

To be noted, although FIG. 2 shows the wafer surface image 2, which has a plurality of first stripes 20 (short dashed lines) and a plurality of second stripes 22 (dotted chain lines), this embodiment does not limited that there are only two kinds of stripes in the wafer surface image 2. Please refer to FIGS. 1A and 3. FIG. 3 is a schematic diagram of a wafer surface image in accordance with another embodiment of the present invention. Similar to the previous embodiment, the wafer surface image 3, generated by the light receiving module 12, can also have the plurality of first stripes 30 (short dashed lines) and the plurality of second stripes 32 (dot chain lines). And, the first stripes 30 and the second stripes 32 in the wafer surface image 3 can also locate between the center A and the edge B, and the first stripes 30 and the second stripes 32 can respectively extend from center A of the wafer surface image 3 radially and outwardly. Different from the previous embodiment, the wafer surface image 3 may further comprise a plurality of third stripes 36 (dot lines), and one of the first stripe 30 can locate between two adjacent third stripes 36.

When distinguishing the first stripe 30, the second stripe 32, and the third stripe 36 by colors, we can assume that the colors of the first stripe 30, the second stripe 32, and the third stripe 36 correspond to red, blue, and green, respectively. The virtual circumference (first circumference) 34 (long dashed line) can be drawn at a preset radius (first distance) from the center A of the wafer surface image 3. The circumference 34 can be regularly occupied by the color of blue (second stripes 32), green (third stripes 36), red (first stripes 30), green (third stripes 36) and then blue (second stripes 32) in sequence. In one example, the processing module 14 can also determine whether the wafer surface image 3 is symmetrical by the color distribution in the wafer surface image 3.

Figure 4:
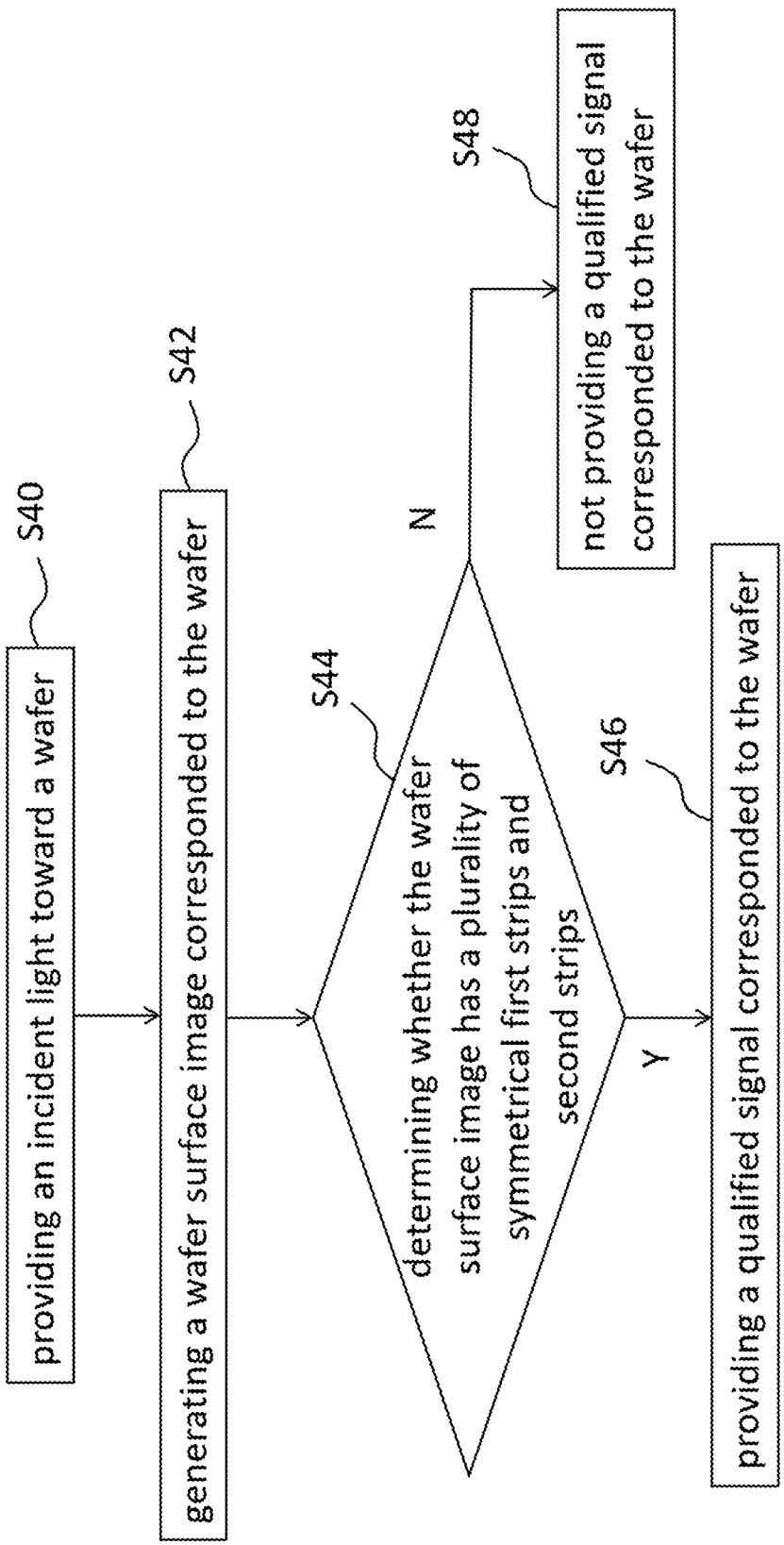
FIG. 4 depicts a flowchart of a wafer testing method in accordance with an embodiment of the present invention.

In order to explain the wafer testing method of the present invention, please refer to FIGS. 1A to 4 together. FIG. 4 depicts a flowchart of a wafer testing method in accordance with an embodiment of the present invention. As shown in the figures, in step S40, the light emitting module 10 can project an incident light onto the wafer 16. In step S42, the light receiving module 12 can generate the wafer surface image 2 corresponded to the wafer 16. In step S44, the processing module 14 can determine whether the wafer surface image 2 has a plurality of first strips 20 and a plurality of second strips 22, and the plurality of first strips 20 and the plurality of second strips 22 are symmetrical. When the processing module 14 determines that the wafer surface image 2 comprises the symmetrical first stripes 20 and second stripes 22, then in step S46, the processing module 14 will provide a qualified signal corresponded to the wafer 16. On the contrary, when the processing module 14 determines that the wafer surface image 2 does not include the symmetrical first stripes 20 and second stripes 22, then in step S48, the processing module 14 will not provide the qualified signal. Since the wafer testing method described in this embodiment has been described in the foregoing wafer testing system embodiment, this embodiment will not be repeated here.

In summary, the wafer, the wafer testing system, and method thereof provided by the present invention can obtain the wafer surface image through the light receiving module without contacting the wafer. After many experiments and verifications, it can be known that if the wafer surface image has a symmetrical pattern, it generally means that the wafer has good quality in the epitaxial process. Therefore, the wafer testing method and system provided by the present invention can directly use the wafer surface image to screen qualified wafers, thereby adjusting recipes or variables in the rest processes, and speeding up the testing of the wafer.

What is claimed is:

1. A wafer testing method, comprising:
providing an incident light toward a wafer;
generating a wafer surface image corresponded to the wafer;
determining whether the wafer surface image has a plurality of first strips and a plurality of second strips, and the plurality of first strips and the plurality of second strips are symmetrical; and
providing a qualified signal corresponded to the wafer when the wafer surface image has the plurality of first strips and the plurality of second strips, and the plurality of first strips and the plurality of second strips are symmetrical.

2. The wafer testing method according to claim 1, wherein the plurality of first strips and the plurality of second strips are symmetrical which indicates that the plurality of first strips and the plurality of second strips are symmetrical to a center of the wafer surface image.

3. The wafer testing method according to claim 2, wherein a first distance from the center of the wafer surface image defines a first circumference, the plurality of first strips and the plurality of second strips are symmetrical which indicates that and the plurality of first strips and the plurality of second strips are regularly arranged on the first circumference.

4. The wafer testing method according to claim 3, wherein the plurality of first stripes extend from the center of the wafer surface image to the first circumference.

5. The wafer testing method according to claim 1, wherein the plurality of first strips and the plurality of second strips are symmetrical which indicates that the plurality of first strips and the plurality of second strips are symmetrical to a line passing through the center of the wafer surface image.

6. The wafer testing method according to claim 1, wherein the plurality of first strips in the wafer surface image indicates that a first light received from a corresponding position of the wafer corresponds to a first measurement range, and the plurality of second stripes in the wafer surface image indicates that a second light received from the corresponding position of the wafer corresponds to a second measurement range, the first measurement range and the second measurement range do not overlap.

7. The wafer testing method according to claim 1, wherein the first measurement range and the second measurement range are ranges of full width at half maximum (FWHM), the first measurement range is smaller than the second measurement range, and the ratio of the first measurement range to the second measurement range is less than 1 and is greater than or equal to 0.5.

8. A wafer testing system, comprising:
a light emitting module, providing an incident light toward a wafer;
a light receiving module, for receiving light from the wafer, and generating a wafer surface image corresponded to the wafer; and
a processing module, coupled with the light receiving module, for determining whether the wafer surface image is symmetrical or not, and generating a qualified signal accordingly;
wherein when the wafer surface image has a plurality of first strips and a plurality of second strips, and the plurality of first strips and the plurality of second strips are symmetrical, the processing module generates the qualified signal.

9. The wafer testing system according to claim 8, wherein the plurality of first strips and the plurality of second strips are symmetrical to a center of the wafer surface image.

10. The wafer testing system according to claim 9, wherein the plurality of first strips and the plurality of second strips extend radially outward from the center of the wafer surface image, respectively.

11. The wafer testing system according to claim 10, wherein the plurality of first strips and the plurality of second strips are symmetrical which indicates that the plurality of first strips and the plurality of second strips are symmetrical to a line passing through the center of the wafer surface image.

12. The wafer testing system according to claim 8, wherein the plurality of first strips in the wafer surface image indicates that a first light received from a corresponding position of the wafer corresponds to a first measurement range, and the plurality of second stripes in the wafer surface image indicates that a second light received from the corresponding position of the wafer corresponds to a second measurement range.

13. The wafer testing system according to claim 12, wherein the first measurement range and the second measurement range are ranges of full width at half maximum (FWHM), the first measurement range is smaller than the second measurement range, and the ratio of the first measurement range to the second measurement range is less than 1 and is greater than or equal to 0.5.

14. A wafer, comprising:
a patterned substrate; and
an epitaxial structure disposed on the patterned substrate;
wherein a wafer surface image corresponded to the epitaxial structure is generated by the wafer testing method of claim 1, the wafer surface image has the plurality of first strips and the plurality of second strips, and the plurality of first strips and the plurality of second strips are symmetrical.

15. The wafer according to claim 14, wherein the plurality of first strips and the plurality of second strips are symmetrical to a center of the wafer surface image.

16. The wafer according to claim 15, wherein the plurality of first strips and the plurality of second strips extend radially outward from the center of the wafer surface image, respectively.

17. The wafer according to claim 14, wherein the wafer surface image is corresponded to a photoluminescence spectrum.

* * * * *